(12) United States Patent
Kumar et al.

(10) Patent No.: US 7,989,248 B2
(45) Date of Patent: Aug. 2, 2011

(54) METHOD OF FORMING MONOLITHIC CMOS-MEMS HYBRID INTEGRATED, PACKAGED STRUCTURES

(75) Inventors: G. Krishna Kumar, Troy, MI (US); Nishit A. Choksi, Troy, MI (US); Joseph M. Chalil, Shelby Township, MI (US)

(73) Assignee: Advanced Microfab, LLC, Troy, MI (US)

( * ) Notice: Subject to any disclaimer, the term of this patent is extended or adjusted under 35 U.S.C. 154(b) by 221 days.

(21) Appl. No.: 12/497,107

(22) Filed: Jul. 2, 2009

(65) Prior Publication Data

US 2011/0003422 A1 Jan. 6, 2011

(51) Int. Cl.
*H01L 21/00* (2006.01)

(52) U.S. Cl. .............................. 438/51; 438/50; 438/53

(58) Field of Classification Search .............. 438/50–55; 257/416–420
See application file for complete search history.

(56) References Cited

U.S. PATENT DOCUMENTS

| | | | |
|---|---|---|---|
| 5,717,631 A | 2/1998 | Carley et al. | |
| 6,012,336 A * | 1/2000 | Eaton et al. | 73/754 |
| 6,060,336 A | 5/2000 | Wan | |
| 6,154,366 A | 11/2000 | Ma et al. | |
| 6,400,009 B1 * | 6/2002 | Bishop et al. | 257/704 |
| 6,403,463 B1 | 6/2002 | Suyama | |
| 6,555,906 B2 | 4/2003 | Towle et al. | |
| 6,759,270 B2 | 7/2004 | Infantolino et al. | |
| 7,030,432 B2 | 4/2006 | Ma | |
| 7,160,752 B2 * | 1/2007 | Ouellet et al. | 438/52 |
| 7,435,612 B2 * | 10/2008 | Xiao et al. | 438/50 |

(Continued)

FOREIGN PATENT DOCUMENTS

EP 1808405 A2 7/2007

(Continued)

OTHER PUBLICATIONS

International Search Report; International Application No. PCT/US2010/040890; issued Feb. 10, 2011.

(Continued)

*Primary Examiner* — Kevin M Picardat
(74) *Attorney, Agent, or Firm* — Gifford, Krass, Sprinkle, Anderson & Citkowski, P.C.

(57) ABSTRACT

A method of forming Monolithic CMOS-MEMS hybrid integrated, packaged structures includes the steps of providing: providing at least one semiconductor substrate having a CMOS device area including dielectric layers and metallization layers; applying at least one protective layer overlying the CMOS device area; forming at least one opening on the protective layer and patterning the dielectric and metallization layers to access the semiconductor substrate; forming at least one opening on the semiconductor substrate by etching the dielectric and metallization layers; applying at least one filler layer in the at least one opening on the semiconductor substrate; positioning at least one chip on the filler layer, the chip including a prefabricated front face and a bare backside; applying a first insulating layer covering the front face of the chip providing continuity from the semiconductor substrate to the chip; forming at least one via opening on the insulating layer covering the chip to access at least one contact area; applying at least one metallization layer overlying the insulating layer on the substrate and the chip connecting the metallization layer on the substrate to the at least one another contact area on the chip; applying a second insulating layer overlying the metallization layer on the at least one chip; applying at least one interfacial layer; applying at least one rigid substrate overlying the interfacial layer; and applying at least one secondary protective layer overlying the rigid substrate.

40 Claims, 11 Drawing Sheets

U.S. PATENT DOCUMENTS

| | | | |
|---|---|---|---|
| 7,736,929 B1 * | 6/2010 | Monadgemi et al. | 438/51 |
| 7,863,071 B1 * | 1/2011 | Ivanov et al. | 438/53 |
| 7,875,484 B2 * | 1/2011 | Yeh et al. | 438/52 |
| 2007/0164378 A1 * | 7/2007 | MacGugan | 257/416 |
| 2007/0224832 A1 | 9/2007 | Zurcher | |
| 2009/0317931 A1 * | 12/2009 | Perruchot et al. | 438/50 |

FOREIGN PATENT DOCUMENTS

| | | |
|---|---|---|
| JP | 2001-185635 A | 7/2001 |
| KP | 10-2009-0031360 | 3/2009 |

OTHER PUBLICATIONS

J. Smith et al.; "Embedded micromechanical devices for the monolithic integration of MEMS with CMOS", Proc. IEDM '95, pp. 609-612, 1995.

W. Daum et al., "Overlay high density Interconnect: A chips-first multichip module technology", IEEE Computer, vol. 26, No. 4, pp. 23-29, Apr. 1993.

J.T. Butler et al., "Advanced Multichip Module Packaging of Microelectromechanical Systems", Tech Digest, Int. Conf. on Solid-State Sensors and Actuators, pp. 261-264, Chicago, IL, Jun. 16-19, 1997.

Analog Devices, Datasheet: "ADXL150/ADXL250 rev.0" Norwood, MA, 1996.

C. Hierold. Intelligent CMOS sensors. Proc. IEEE MEMS 2000, pp. 1-6, 2000.

P.F. van Kessel et al., A MEMS-based projection display. Proc. IEEE 86 (1998) pp. 1687-1704.

* cited by examiner

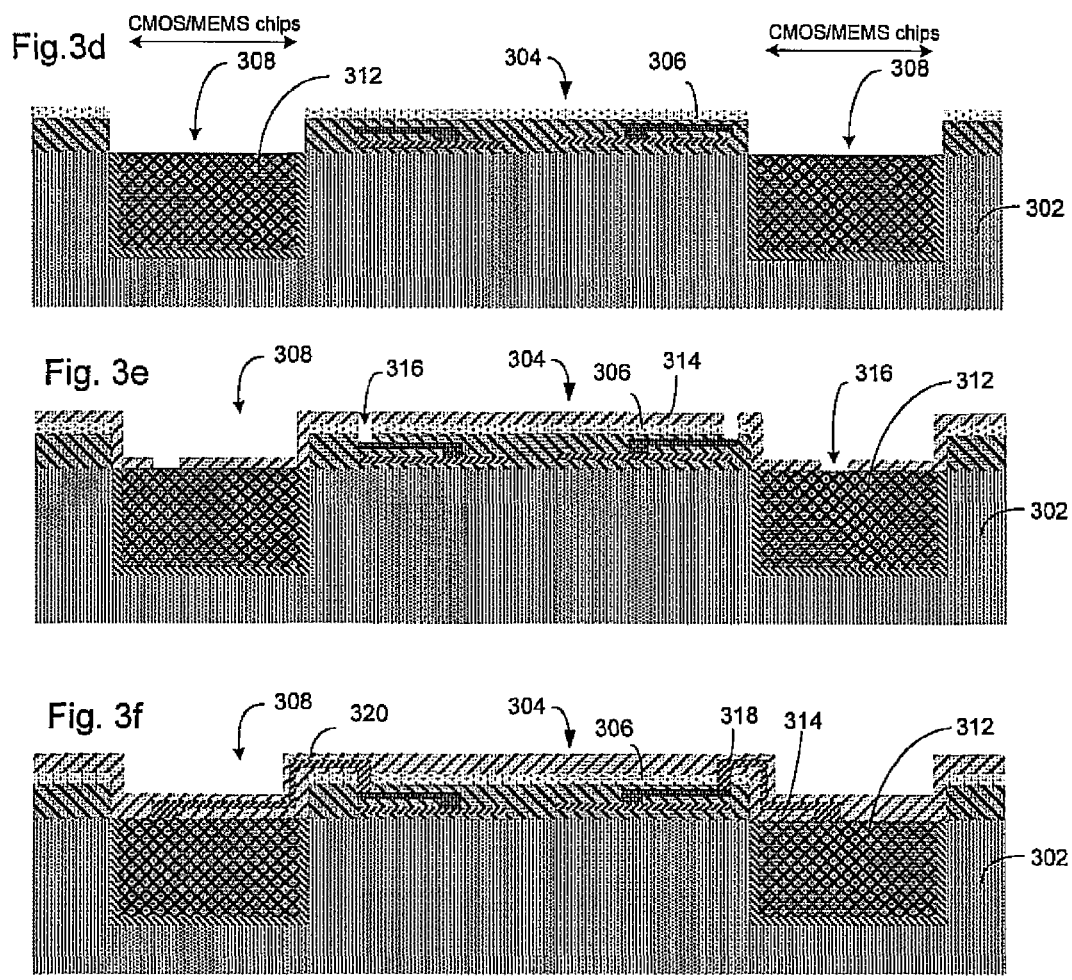

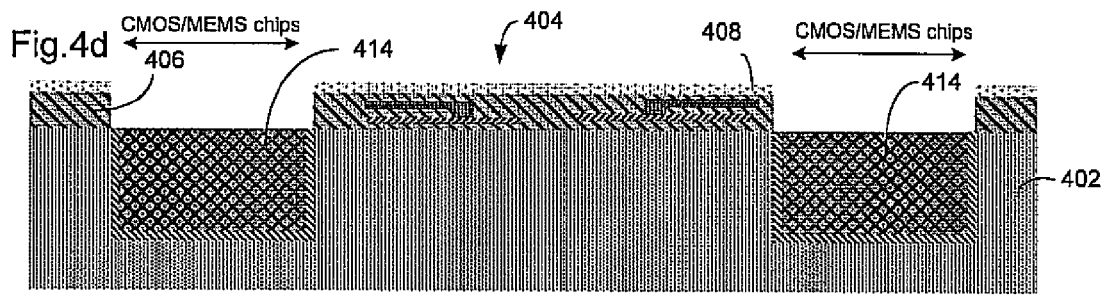
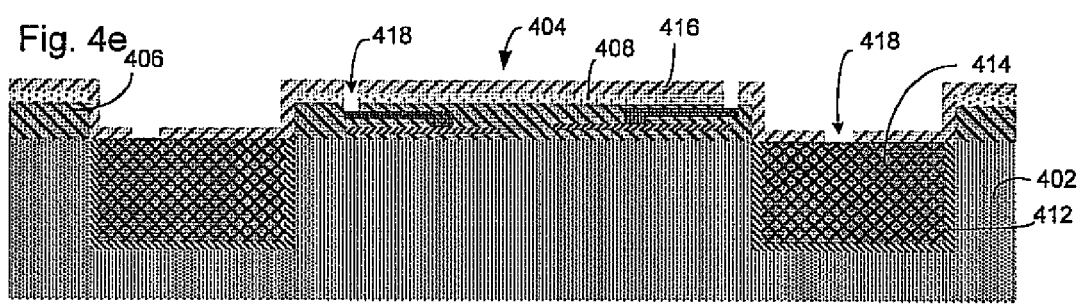
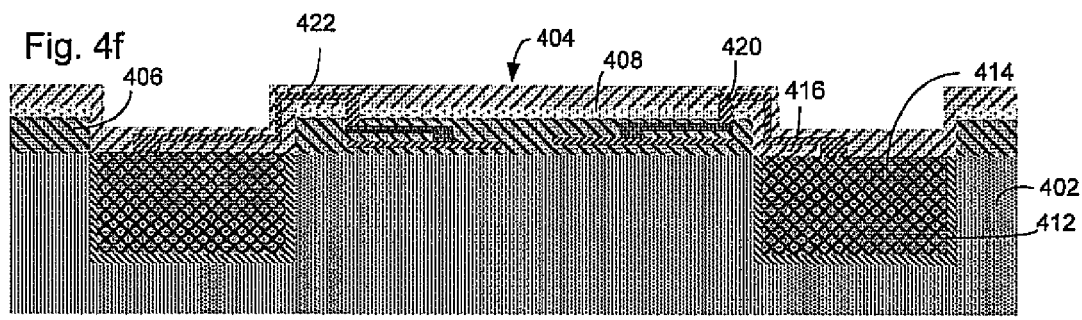

METHOD OF FORMING MONOLITHIC CMOS-MEMS HYBRID INTEGRATED, PACKAGED STRUCTURES

FIELD OF THE INVENTION

The invention relates to a method for integrating MEMS and CMOS structures.

BACKGROUND OF THE INVENTION

Monolithic integration of MEMS/NEMS and electronics offers significant benefits enabling high volume production driving down the per-unit costs of sensor and actuator systems significantly. Micromechanical transducer systems not only need to receive analog and digital electrical inputs and transmit the output, but should also be able to measure rotation, strain, temperature, pressure, acceleration, infrared radiation, micro fluidic chemical properties of liquids and gasses. Effective integration offers other benefits, including, simplifying interconnect issues, reduced packaging and fabrication complexity and significantly improving the overall performance and ease of use for the device.

One method of monolithic integration of CMOS and MEMS is to modify the complementary metal-oxide semiconductor (CMOS) foundry facility to fabricate micromechanical structures. Some of the commonly used micromechanical (MEMS) mechanical structures like polysilicon, nitride etc require high-temperature processing during deposition and annealing to relieve stress and this cannot be performed on the same substrate in the presence of CMOS electronics due to the lower temperature limitation of the metals in CMOS. Another limitation of the method is that CMOS requires the substrate to be planar after the MEMS fabrication to achieve high-resolution features in the photolithographic process. Thus, the current CMOS-MEMS integration methodologies faces serious limitations, requiring sacrificing materials and allowing very little flexibility in device design.

Monolithic integration process may be divided into three classes: (1) Pre CMOS (2) Intermediate CMOS (3) Post CMOS. In prior art "pre CMOS" fabrication process methods, MEMS/NEMS structures are fabricated before the electronics are integrated. One example of this process is the micromechanics-first approach developed at Sandia National Laboratory by J. Smith et al. In this process a pre-etched trench is used to house the MEMS structures. After the fabrication of the desired MEMS structures, this housing is refilled with oxide, planarized using chemical-mechanical polishing (CMP), and finally sealed with a nitride membrane. Conventional CMOS processing was then carried out next to this MEMS area. This defined a CMOS device area and micromechanical device area on the same substrate as shown in FIG. 1. One of the disadvantages with this process is that it needs a dedicated production line and the process is complicated.

In the Intermediate CMOS fabrication process, the process flow between CMOS and MEMS is mixed in the sequence. Initially a part of the CMOS process is performed and then paused for additional thin film deposition or micromachining steps. Some of the commercially available sensors in this art include the Analog Devices integrated MEMS and Infineon's pressure sensor shown by C. Hierold. In the post CMOS process, MEMS/NEMS structures are fabricated after the CMOS or electronics is fabricated on the substrate. The disadvantage of this process is the temperature limitation of the process to below 400° C. to protect the aluminum in the electronics. This leads to the elimination of commonly used MEMS/NEMS high temperature materials like LPCVD polysilicon, silicon nitride etc.

An alternative approach to integration and packaging using high density interconnect (HDI) multichip modules (MCMs) was developed by researchers at GE Corporate Research and Development center as a "chips first" approach described in by W. Daum et al. as shown in FIG. 2. This process involves placing bare chips of MEMS test die and a generic CMOS electronics die into mechanically milled cavities on a base substrate and then fabricating the thin-film interconnect structure on top of the components. A computer-controlled argon ion laser system drills via holes through the polyimide film directly to the chip I/O pads. The interconnection metallization and via contacts were formed by a combined sputtering/electroplating process and patterned by computer-controlled adaptive laser lithography and etching. Some of the limitations with this process were the warping of the MEMS device due to excessive heating during the laser ablation step.

Prior art monolithic integration processes in this art involve utilizing complimentary metal-oxide semiconductor (CMOS) semiconductor layers to fabricate micromechanical structures is shown in U.S. Pat. No. 5,717,631, U.S. patent application Ser. No. 11/602,087, U.S. Pat. No. 6,060,336. Some of the major limitations with this approach involve the need to sacrifice MEMS/NEMS materials with various mechanical properties as commercial foundries cannot modify their processes to suit MEMS/NEMS. This also adds additional constraints when fabricating the MEMS/NEMS sensors or actuators as they would need to limit their processing techniques like etching, deposition so as to not harm the electronic circuits present on the substrate. Stress and other mechanical deficiencies may lead to device failure when the materials tailored to CMOS are modified as mechanical elements in MEMS.

Prior art hybrid MCM technology processes include putting one or several dies with different functionality into prefabricated trenches on a substrate, planarizing these chips, providing an insulator layer on top and forming electrodes have been demonstrated in U.S. Pat. No. 6,403,463, U.S. Pat. No. 6,780,696 B1, U.S. Pat. No. 6,154,366, U.S. Pat. No. 6,759,270. Some of the major drawbacks in these prior art references include semiconductor substrates like silicon that are fragile and the devices need to be repackaged resulting in significant costs.

The invention describes a method of manufacture for Monolithic hybrid integration of CMOS-MEMS with enhanced flexibility of using materials without hindrance to process parameters. This invention enables this integration effectively without the need to sacrifice the inherent strengths of both the CMOS or MEMS technologies and bringing about their fusion in a hybrid approach on a common substrate. This invention also allows the ability to effectively package the entire system after integration.

Several of the limitations mentioned above are overcome in the present invention which describes a method to effectively synergize CMOS-MEMS/NEMS functionality and finally package them creating a very cost effective, reliable, robust transduction system In the present invention, protective layers are coated on the substrate to protect either the CMOS device area in the "Post CMOS" process or the MEMS device area in the "Pre CMOS" process to prevent damage to the sensor or electronics. Oxygen plasma etching can be used to open the vias to access conductive layers, being precisely defined by photolithography instead of laser which is known to cause damage in some of the previous integration approaches.

Either the "Post CMOS" or "Pre CMOS" fabrication may be carried out on a semiconductor substrate without compromising on the individual technologies strength and then integrating CMOS if MEMS is already present or MEMS if CMOS is already present on the same substrate.

The invention provides an improved ability to effectively package an entire system using a glass, silicon, plastic or metal housing. Packaging provides physical protection against external scratching and breakage, environmental protection and any other external forces that may damage the leads or the sensors. Effective packaging of the integrated system leads to lower cost, improved reliability and improved performance. This invention addresses some of the important issues present in current packaging methodologies. As one specific example related to reliability issues with plastic packages, the Thermal coefficient of expansion (TCE) mismatch resulting from the curing of the resins as they shrink in volume, creates a large temperature differential resulting in large strain mismatch, damaging the wire bonds. This issue can be eliminated or reduced significantly in the present invention as there will be no wire bonds involved and the fabrication is planar and the metal traces can be more effectively protected. The packaging methodology from the current invention also eliminates the need for solder bumps for integration of CMOS-MEMS and packaging. The invention also provides a method to further encapsulate the entire system by adding a secondary protective layer of organic materials providing a very effective packaging methodology.

SUMMARY OF THE INVENTION

Accordingly, the invention relates to a method of forming Monolithic CMOS-MEMS hybrid integrated, packaged structures. In one aspect, the method includes the steps of providing: providing at least one semiconductor substrate having a CMOS device area including dielectric layers and metallization layers; applying at least one protective layer overlying the CMOS device area; forming at least one opening on the protective layer and patterning the dielectric and metallization layers to access the semiconductor substrate; forming at least one opening on the semiconductor substrate by etching the dielectric and metallization layers; applying at least one filler layer in the at least one opening on the semiconductor substrate; positioning at least one chip on the filler layer, the chip including a prefabricated front face and a bare backside; applying a first insulating layer covering the front face of the chip providing continuity from the semiconductor substrate to the chip; forming at least one via opening on the insulating layer covering the chip to access at least one contact area; applying at least one metallization layer overlying the insulating layer on the substrate and the chip connecting the metallization layer on the substrate to the at least one another contact area on the chip; applying a second insulating layer overlying the metallization layer on the at least one chip; applying at least one interfacial layer; applying at least one rigid substrate overlying the interfacial layer; and applying at least one secondary protective layer overlying the rigid substrate.

In another aspect, the method includes the steps of: providing a semiconductor substrate having MEMS/NEMS materials including mechanical structural layers and conductive layers; applying a first insulating layer overlying the MEMS/NEMS materials; applying at least one protective layer overlying the MEM/NEMS materials; forming at least one opening on the protective layer to access the semiconductor substrate; applying at least one filler layer in the at least one opening on the semiconductor substrate; positioning at least one chip on the filler layer, the chip including a front face and a bare backside; applying a second insulating layer covering the front face of the chip providing continuity from the semiconductor substrate to the chip; forming at least one via opening on the insulating layer covering the chip to access at least one contact area; applying at least one metallization layer overlying the insulating layer on the substrate and the chip connecting the metallization layer on the substrate to the at least one another contact area on the chip; applying a third insulating layer overlying the metallization layer on the at least one chip; performing at least one post micro/nano fabrication etching step; applying at least one interfacial layer; applying at least one rigid substrate overlying the interfacial layer; and applying at least one secondary protective layer overlying the rigid substrate.

BRIEF DESCRIPTION OF THE DRAWINGS

FIG. 4(h1-h5) is a cross-sectional view showing the post fabrication of the integrated CMOS MEMS realizing anisotropic etching in the front and backside and finally packaged.

DETAILED DESCRIPTION OF THE PREFERRED EMBODIMENTS

Referring to the various Figures there is shown an effective, reliable, and relatively low cost method of integration between CMOS-MEMS/NEMS.

In one embodiment of a "post CMOS" or "CMOS first" hybrid integration approach shown in FIGS. 3a-3h, the already fabricated CMOS semiconductor substrate is modified to achieve this integration. The CMOS device area is first protected so as not to affect their functionality in the ensuing process; fabrication is continued on the same substrate and integrated by coupling the micromechanical structures in a hybrid approach by placing the MEMS/NEMS dies that have been diced. The integrated system is finally packaged in an effective manner.

Figure 3A:
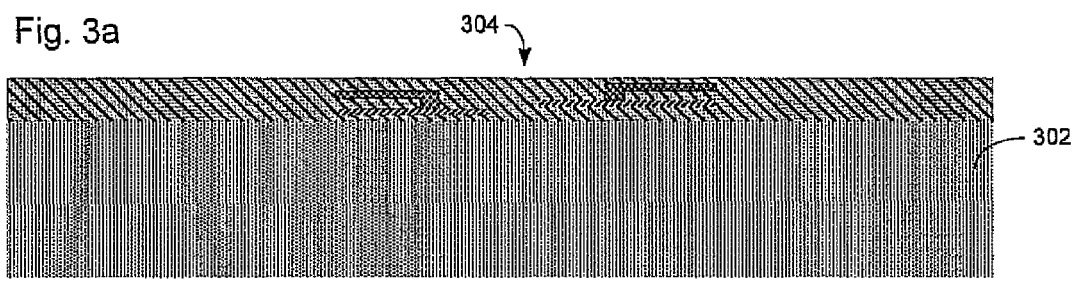
FIG. 3a-3h is a cross-sectional view showing the process flow for building a "post CMOS" monolithic CMOS-MEMS hybrid integration system and packaging.

Again referring to FIGS. 3a-h, there is shown a cross-sectional process flow for the "Post CMOS" monolithic hybrid integration approach on a semiconductor substrate 302. A CMOS fabricated semiconductor substrate 302 with dielectric layers and metallization in FIG. 3a is provided as a starting point in the integration process. The CMOS device area 304 may include digital logic circuits, operational amplifiers, inverters, analog and digital circuitry, digital switches, voltage comparators which enable the sensors and actuators to receive analog and digital signals for their effective operation.

Figure 3B:
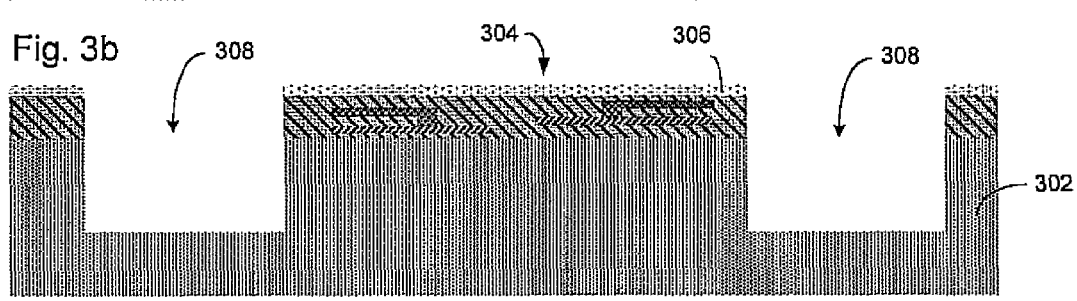

Next, as shown in FIG. 3b, a protective layer 306 may be applied to the CMOS semiconductor substrate 302 by either spin coated or deposited in vacuum to protect the CMOS area 304 from further processing steps. Protective layer 306 may be selected from oxides, nitrides, polymers, or their combination having a thickness of sub-microns to several microns and that which can effectively protect the electronics. The protective layer 306 may be selectively patterned using lithography and etched anisotropically using oxygen plasma RIE for materials such as polyimide and parylene to define a trench 308 outside of the CMOS device area 304. The trench 308 may be etched using DRIB Bosch process and may be lithographically defined by the size of a chip 312. The protective layer 306 may be left behind or removed.

Figure 3C:
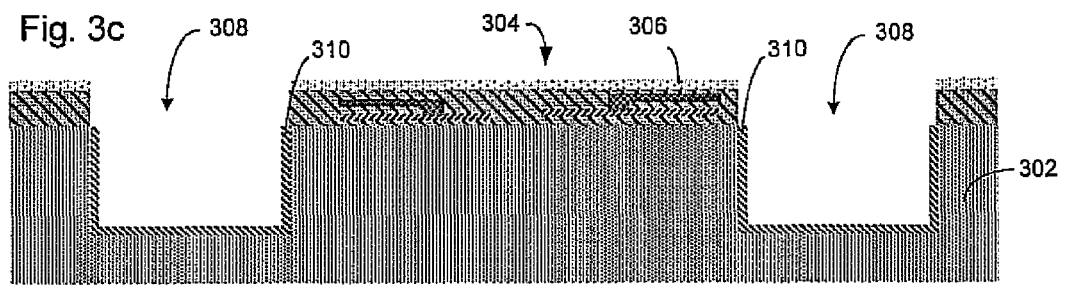

In a following step, as shown in FIG. 3c, a filler layer 310 may be deposited or dispensed into the trench 308 to anchor a chip 312 into the trench 308 and also to fill a gap between the chip 312 and the wall of the trench 308 and will also ensure the planarity of the chip 312 to the substrate 302. The filler material 310 may be selected from oxides, polyimides, silicones, epoxies, or their combination or any other materials with similar properties.

In a next step as shown in FIG. 3d, the chip 312 of CMOS, MEMS/NEMS or a combination of them may be placed in the trench 308. As described above, a CMOS integrated chip may include voltage comparators, diodes, op-amps, or other electronic components like power management circuits, resistors, capacitors, and inductors. A MEMS/NEMS dies may include but are not limited to accelerometers, resonators, micro-gyroscopes, microphones, micro-bolometers, transducers involving chemical and biological, optical, mechanical, radiation, thermal, capacitive, rotation, strain, magnetic and electromagnetic, flow, and micro-fluidic chemical properties of liquids and gases.

In a following step as shown in FIG. 3e, a first insulating layer 314 may be deposited covering the front face and/or the sides of the chip 312 providing the continuity from the semiconductor substrate 302 to the chip 312. The first insulating layer 314 may be selected from polymers, oxides, nitrides, glass, quartz polyimide, parylene, silicone, or a combination of the above. At least one via opening 316 may be etched through the first insulation layer 314 to make electrical contact. The first insulation layer 314 may be anisotropically etched using oxygen plasma or may be etched using wet or dry etching.

In a next step as shown in FIG. 3f, a metallization layer 318 may be applied to connect the CMOS area 304 on the semiconductor substrate 302 to the chip 312 which may include a contact area having an input/output pad or bond area to make electrical contact. The metallization layer 318 may be selected from metals such as, aluminum, copper, titanium, chrome, gold, silver, iridium or their combination that can be evaporated, sputtered or electroplated. A second insulating layer 320 may be deposited overlying the CMOS area 304 on the semiconductor substrate 302 covering the via 316 and overlying the metallization layer 318 on the chip 312. The second insulation layer 320 may be selected from polymers including polyimide, parylene, silicones, oxides, nitrides, glass, quartz or their combination. A person of ordinary skill in this art will be able to easily make further alterations and modifications in packaging after reading the present invention. It can easily be inferred that any particular embodiment illustrated with diagrams and explained cannot be considered limiting. For example the metallization layer 318 may include multiple layers sandwiched between multiple insulating layers 320 connecting multiple devices and/or multiple chips on the substrate.

Figure 3G:
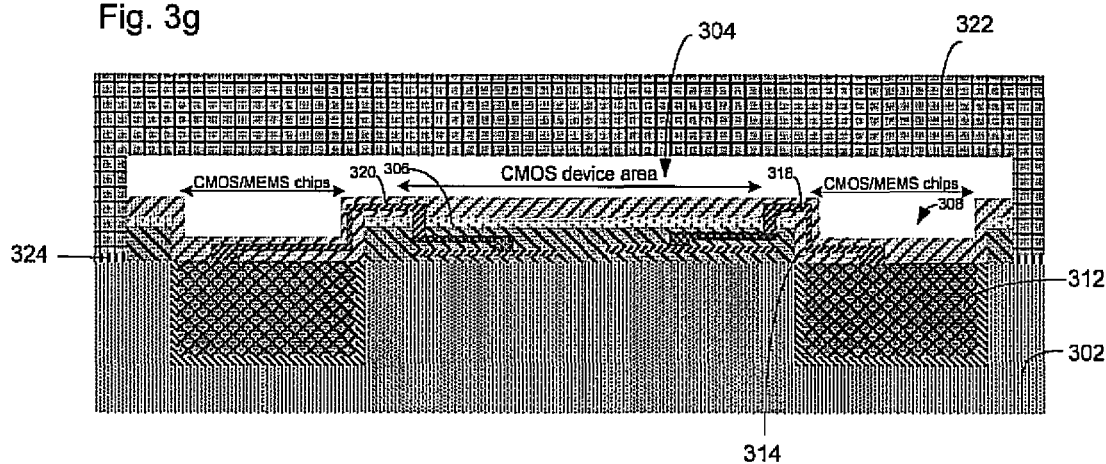

In a next step as shown in FIG. 3g, the packaging of the integrated device is detailed. The packaging of the device may include aligning a rigid substrate 322 and bonding it to the substrate 302 by using an interfacial material 324. The packaging substrate 322 may be selected from ceramics, thermoplastics, thermosets, glass, silicon, quartz, plastic or metals. The bonding may be anodic, eutectic, solder, polymer or fusion bonding. The interfacial material 324 may be selected from metal and/or alloys like gold, tin, epoxies like Benzocyclobuten (BCB) and SU8.

Figure 3H:
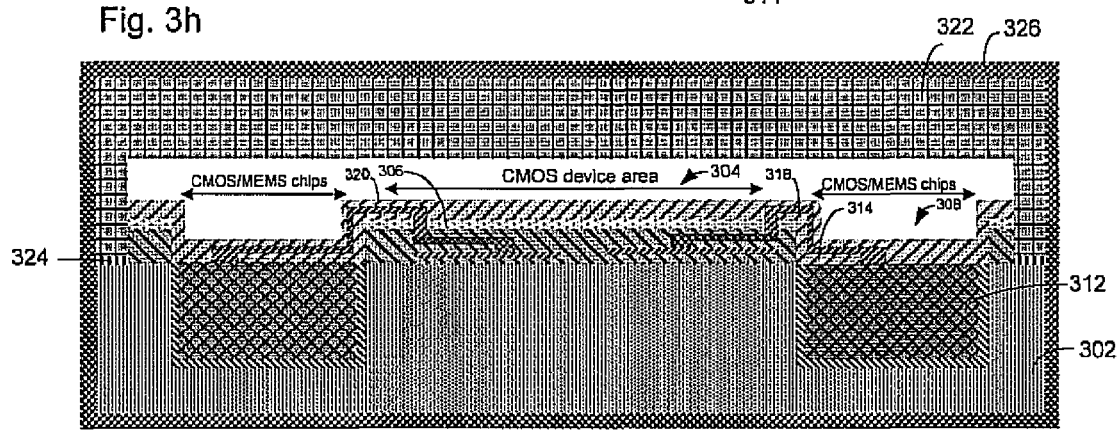

In a subsequent step as shown in FIG. 3h, a secondary protective layer 326 may be applied overlying the rigid substrate 322. The secondary protective layer 326 may be selected from polymers, oxides, nitrides, metals or a combination of them. A person of ordinary skill in this art will be able to easily make further alterations and modifications in packaging after reading the present invention.

Figure 4A:
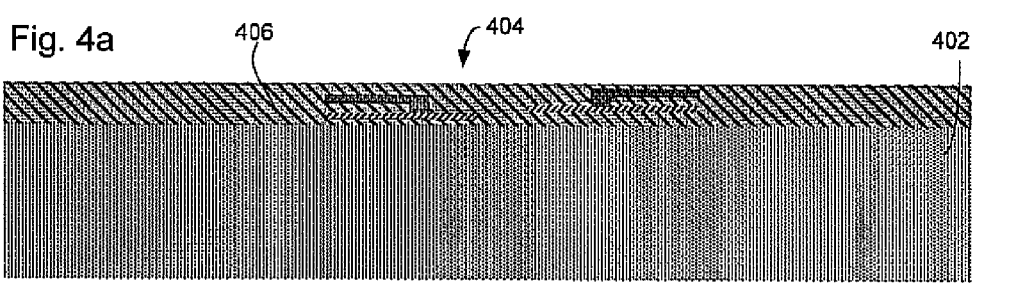
FIG. 4a-FIG. 4f is a cross-sectional view showing the process flow for building a "pre CMOS" monolithic CMOS-MEMS hybrid integration system.
Figure 4B:
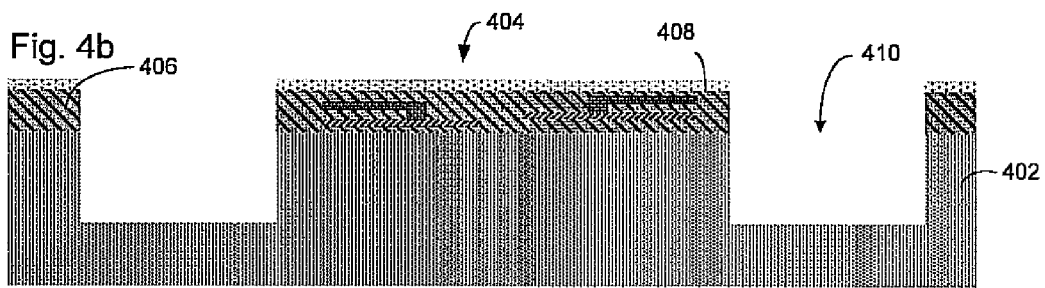
Figure 4C:
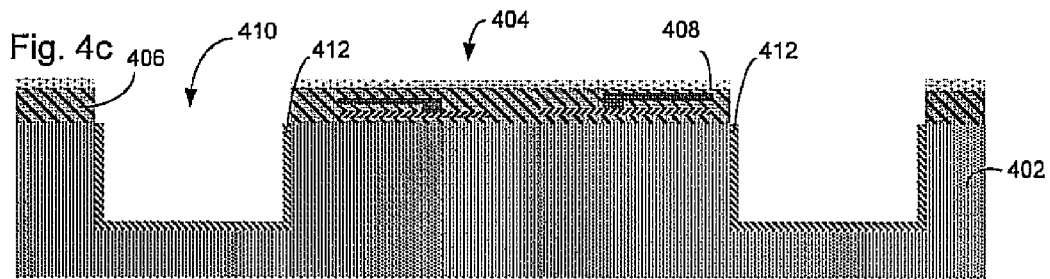
Figures 1, 4G:
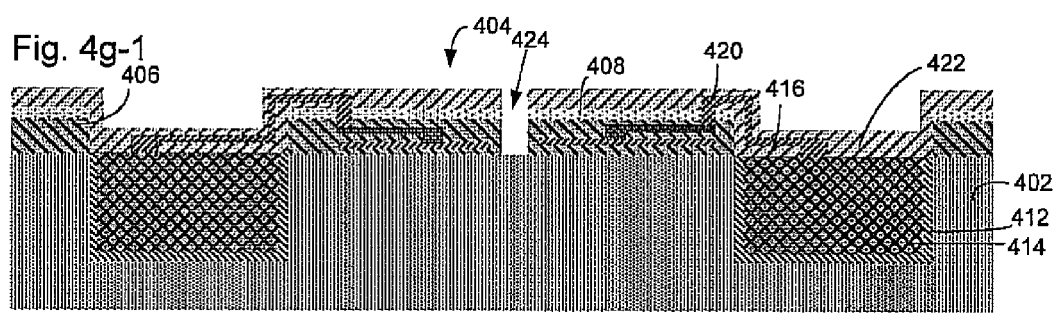
Figures 2, 4G:
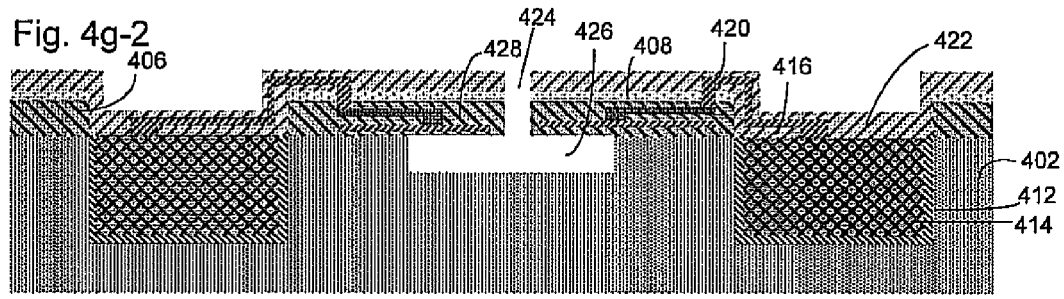
Figures 3, 4G:
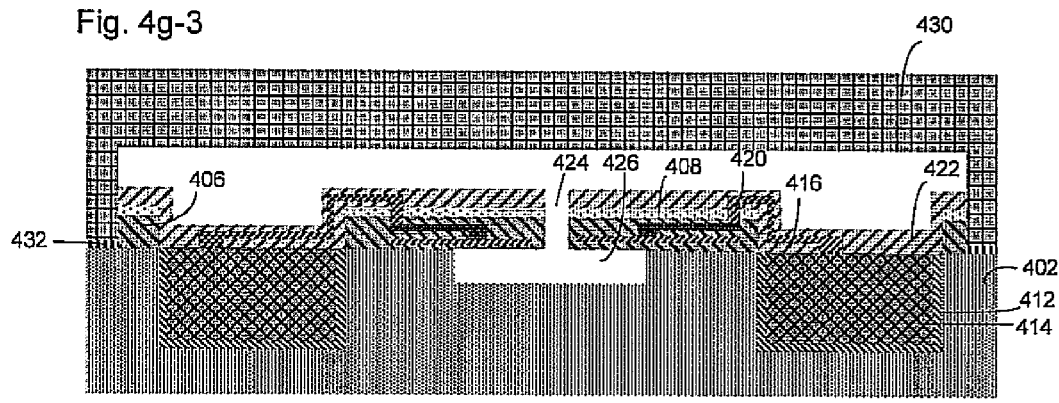
FIG. 4(g1-g4) is a cross-sectional view showing the post fabrication of the integrated CMOS MEMS realizing a suspended structure using isotropic etching and finally packaged.
Figures 4, 4G:
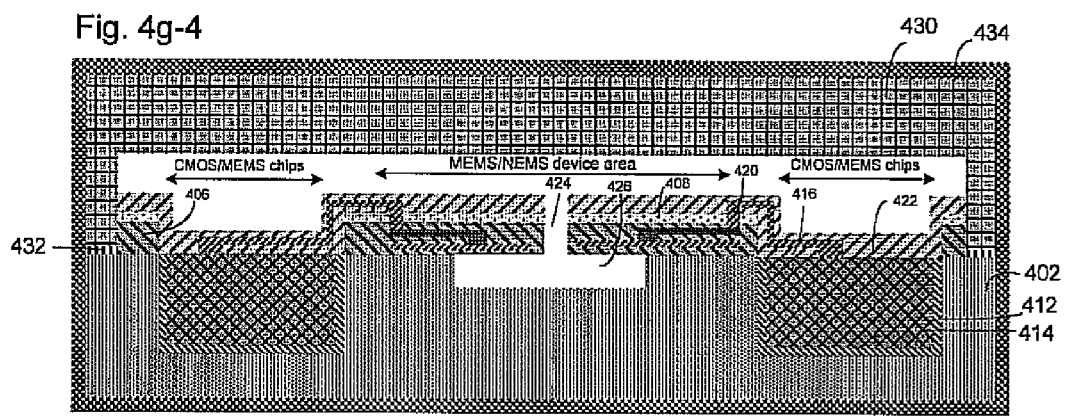

A second embodiment of a "Pre CMOS" monolithic hybrid integration approach is shown in FIG. 4. The second embodiment may include micromachined micromechanical systems involving high temperature materials including but not limited to LPCVD oxide, nitride and polysilicon to effectively fabricate transducers including but not limited to accelerometers, resonators, micro-gyroscopes, microphones, micro-bolometers, etc. A protective layer may be coated on the MEMS device area on the substrate to protect them from further fabrication steps that will be carried out on the same substrate. This protective layer protects the MEMS device area from the ensuing chemical etching. The CMOS electronics dies or any other MEMS/NEMS chips may be placed in a photolithographically etched trench with the help of a filler material and then connected to the already fabricated portion of the MEMS/NEMS device area with metallization evaporated or sputtered. The CMOS or electronic dies also involve more sophisticated circuits including digital interfaces and micro controllers. Thus the temperature limitation of the process to below 400° C. to protect the aluminum in the electronics, which has been the limiting step in some of the current integration methodologies, can now be overcome with the present invention with the potential to realize several novel devices. Processing can further resume on the MEMS device area by protecting the CMOS and or MEMS/NEMS chip areas and the MEMS/NEMS device area to realize a released structural layer and any other requirement depending on a specific application. It should be realized that a person of ordinary skill in this art will be able to make further alterations and modifications.

FIG. 4 illustrates a cross-sectional process flow for the "Pre CMOS" monolithic hybrid integration approach on a substrate 402.

Referring to FIG. 4a there is shown a first step including providing a substrate 402 that may be a semi-conductor insulator as described above. The substrate 402 may include MEMS/NEMS materials 404 applied thereon. In one aspect, the MEMS/NEMS material 404 that can be made conductive include high temperature MEMS materials such as LPCVD polysilicon that can be later doped in boron or phosphorous and or may also include LPCVD nitride and or metals such as aluminum, copper, titanium, chrome, gold, silver, iridium or their combination that can be evaporated, sputtered or electroplated. In the illustrated embodiment, a first insulating layer 406 may be applied to the MEMS/NEMS materials 404.

Next, as shown in FIG. 4b, a protective layer 408 may be applied to the semiconductor substrate 402 by either spin coating or depositing in vacuum to protect the MEMS/NEMS area 404 from further processing steps. Protective layer 408 may be selected from oxides, nitrides, polymers, or their combination having a thickness of sub-microns to several microns and that which can effectively protect the electronics. The protective layer 408 may be selectively patterned using lithography and etched anisotropically using oxygen plasma WE for materials such as polyimide and parylene to define a trench 410 outside of the MEMS/NEMS area 404. The trench 410 may be etched using DRIE Bosch process and may be lithographically defined by the size of chips 414. The protective layer 408 may be left behind or removed.

In a following step, as shown in FIG. 4c, a filler layer 412 may be deposited or dispensed into the trench 410 to anchor the chip 414 into the cavity and also to fill a gap between the chip 414 and the wall of the trench 410 and will also ensure the planarity of the chip 414 to the substrate 402. The filler material 412 may be selected from oxides, polyimides, silicones, epoxies, or their combination or any other materials with similar properties.

In a next step as shown in FIG. 4d, the chip 414 of CMOS, MEMS/NEMS or a combination of them may be placed in the trench 410. As described above, a CMOS integrated chip may include voltage comparators, diodes, op-amps, or other electronic components like power management circuits, resistors, capacitors, and inductors. A MEMS/NEMS dies may include but are not limited to accelerometers, resonators, micro-gyroscopes, microphones, micro-bolometers, transducers involving chemical and biological, optical, mechanical, radiation, thermal, capacitive, rotation, strain, magnetic and electromagnetic, flow, and micro-fluidic chemical properties of liquids and gases In a following step as shown in FIG. 4e, a second insulating layer 416 may be deposited covering the front face and/or the sides of the chip 414 providing the continuity from the semiconductor substrate 402 to the chip 414. The second insulating layer 416 may be selected from polymers, oxides, nitrides, glass, quartz polyimide, parylene, silicone, or a combination of the above. At least one via opening 418 may be etched through the second insulation layer 416 to make electrical contact. The second insulation layer 416 may be anisotropically etched using oxygen plasma or may be etched using wet or dry etching.

In a next step as shown in FIG. 4f, a metallization layer 420 may be applied to connect the MEMS/NEMS on the semiconductor substrate 402 to the chip 414 which may include a contact area having an input/output pad or bond area to make electrical contact. The metallization layer 420 may be selected from metals such as, aluminum, copper, titanium, chrome, gold, silver, iridium or their combination that can be evaporated, sputtered or electroplated. A third insulating layer 422 may be deposited overlying the MEMS/NEMS on the semiconductor substrate 402 covering the via 418 and overlying the metallization layer 420 on the chip 414. The third insulation layer 422 may be selected from polymers including polyimide, parylene, silicones, oxides, nitrides, glass, quartz or their combination. A person of ordinary skill in this art will be able to easily make further alterations and modifications in packaging after reading the present invention. It can easily be inferred that any particular embodiment illustrated with diagrams and explained cannot be considered limiting. For example the metallization layer 420 may include multiple layers sandwiched between multiple insulating layers 422 connecting multiple devices and/or multiple chips on the substrate.

Figure 1:
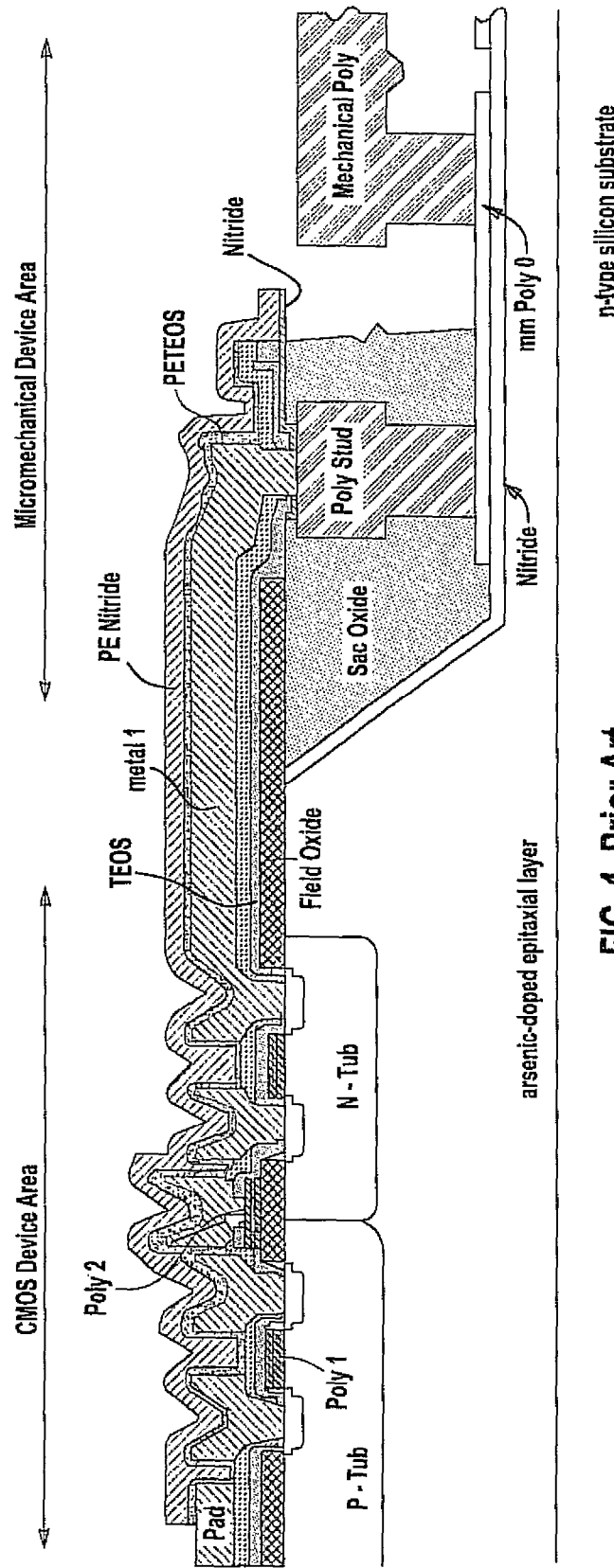
FIG. 1 Prior Art showing cross-section of the embedded micromechanics approach to CMOS/MEMS integration from Sandia National labs.
Figure 2:
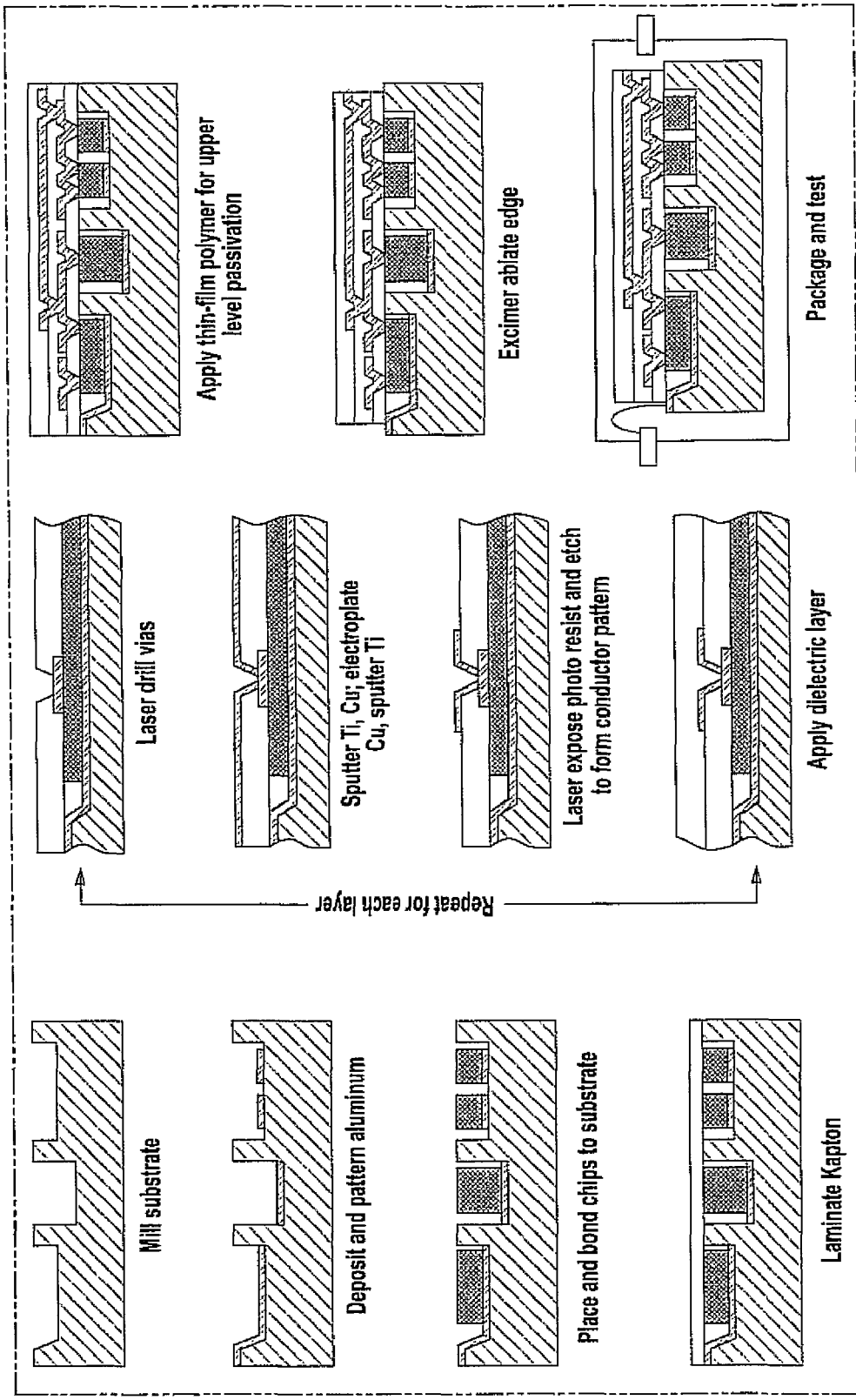
FIG. 2 Prior Art showing simplified cross-sectional view of HDI interconnect MCM technology from GE.

Referring to FIG. 4g-1 and FIG. 4g-2 there is shown a next step detailing a post micro/nano fabrication step after the integration to realize released mechanical structures 421. The third insulation layer 422 may provide a protective layer for the ensuing fabrication. In the detailed embodiment the insulating layers are patterned and etched to create an opening 424 on the substrate 402. The opening 424 may be formed by anisotropic etching. The mechanical structural layers of the MEMS/NEMS 404 can be released using an isotropic etch forming a cavity 426. The cavity 426 defines a sandwiched suspended structure 428.

In a next step as shown in FIG. 4g-3, the packaging of the integrated device is detailed. The packaging of the device may include aligning a rigid substrate 430 and bonding it to the substrate 402 by using an interfacial material 432. The packaging substrate 430 may be selected from ceramics, thermoplastics, thermosets, glass, silicon, quartz, plastic or metals. The bonding may be anodic, eutectic, solder, polymer or fusion bonding. The interfacial material 432 may be selected from metal and/or alloys like gold, tin, epoxies like Benzocyclobuten (BCB) and SU8.

In a subsequent step as shown in FIG. 4g-4, a secondary protective layer 434 may be applied overlying the rigid substrate 430. The secondary protective layer 434 may be selected from polymers, oxides, nitrides, metals or a combination of them. A person of ordinary skill in this art will be able to easily make further alterations and modifications in packaging after reading the present invention.

Figures 1, 4H:
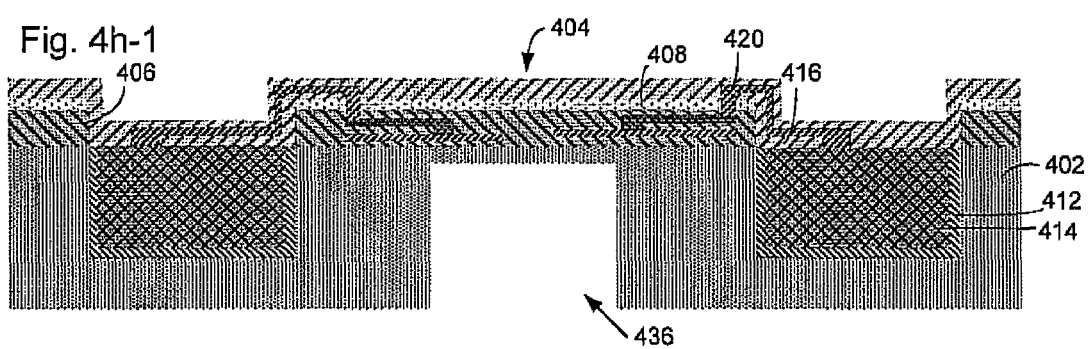
Figures 2, 4H:
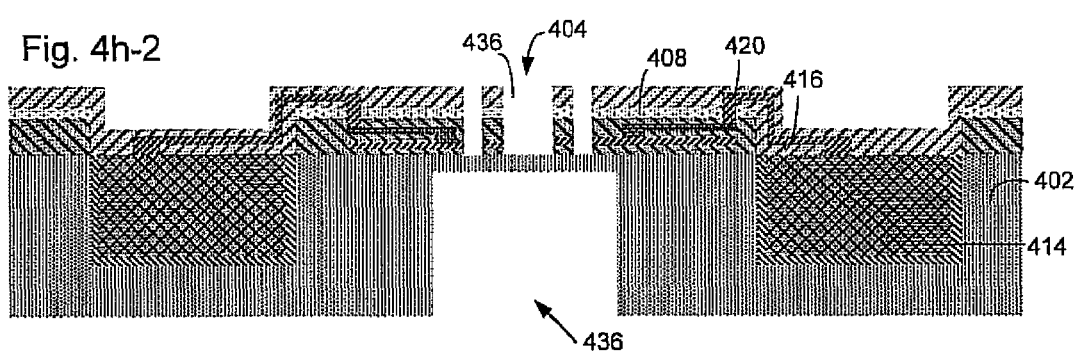
Figures 3, 4H:
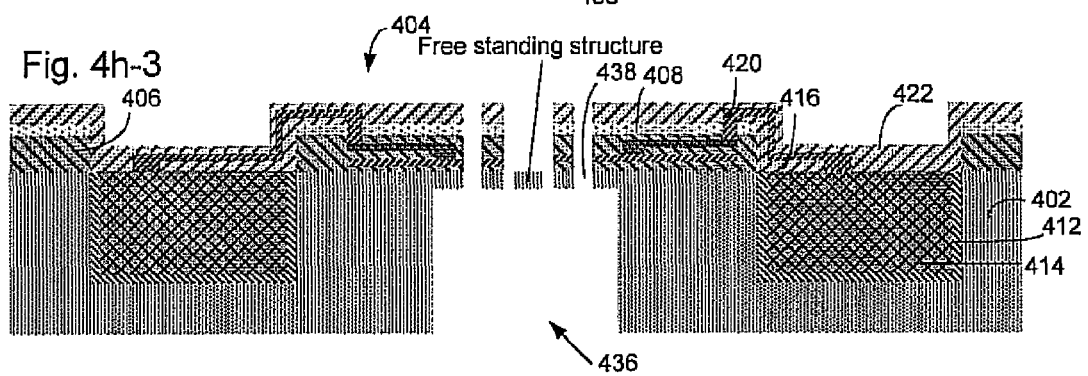
Figures 4, 4H:
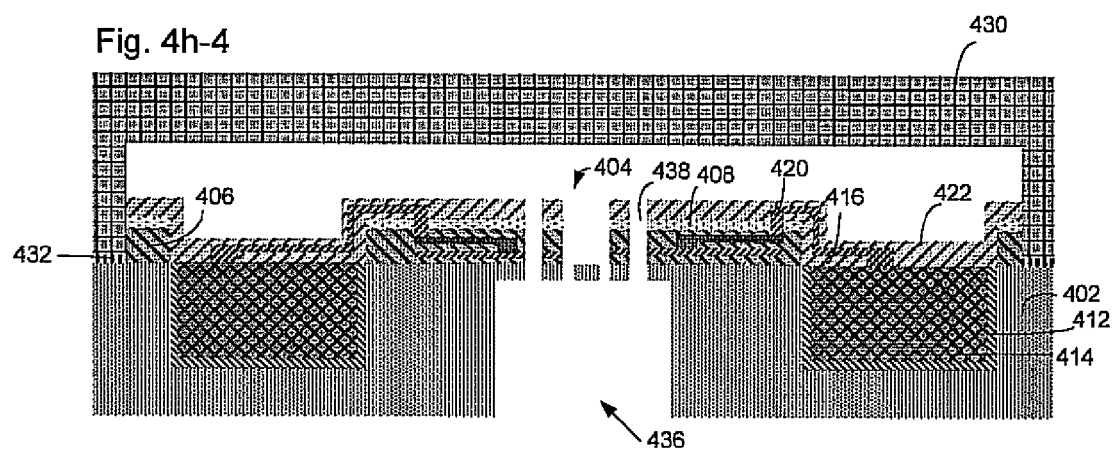

Referring to FIG. 4h-1 to FIG. 4h-3 there is shown an alternative embodiment of the post micro/nano fabrication step after the integration to realize released mechanical structures. The third insulation layer 422 may provide a protective layer for the ensuing fabrication. In the detailed embodiment, the backside of the substrate 402 is etched indicated by 436 and shown in FIG. 4h-1. In the ensuing fabrication the insulating layers may be patterned and etched to create several openings 436 on the substrate 402. The openings 436 may be formed by anisotropic etching. The mechanical structural layers of the MEMS/NEMS 404 can be released using another anisotropic etch shown in FIG. 4h-3, forming a free standing and or suspended structure 438.

In a next step as shown in FIG. 4h-4, the packaging of the integrated device is detailed. The packaging of the device may include aligning a rigid substrate 430 and bonding it to the substrate 402 by using an interfacial material 432. The packaging substrate 430 may be selected from ceramics, thermoplastics, thermosets, glass, silicon, quartz, plastic or metals. The bonding may be anodic, eutectic, solder, polymer or fusion bonding. The interfacial material 445 may be selected from metal and/or alloys like gold, tin, epoxies like Benzocyclobuten (BCB) and SU8.

Figures 4, 4H, 5:
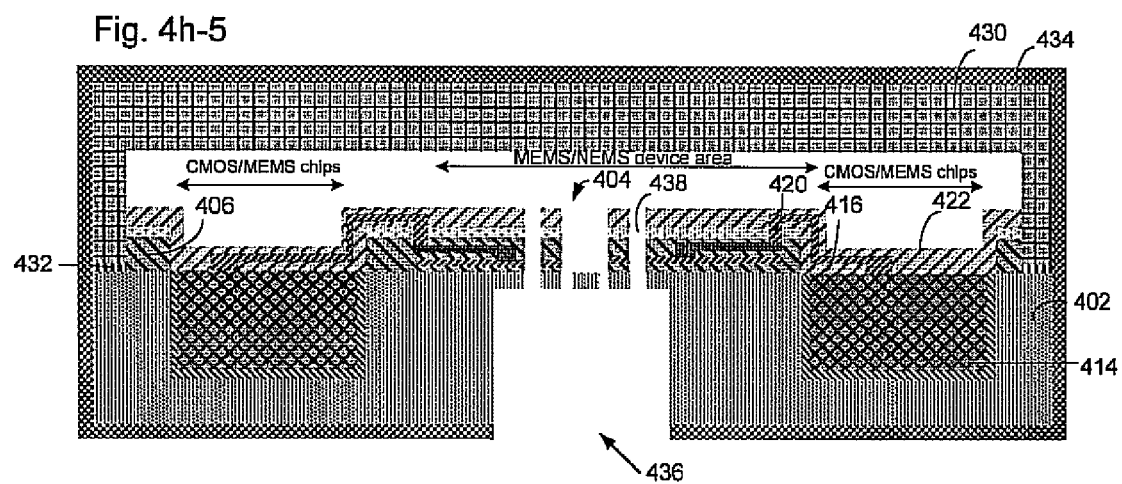

In a subsequent step as shown in FIG. 4h-5, a secondary protective layer 434 may be applied overlying the rigid substrate 430. The secondary protective layer 434 may be selected from polymers, oxides, nitrides, metals or a combination of them. A person of ordinary skill in this art will be able to easily make further alterations and modifications in packaging after reading the present invention.

While the above examples provide a description of the process of the present invention, they should not be read as limiting the process of the present invention. The invention has been described in an illustrative manner. It is to be understood that the terminology which has been used is intended to be in the nature of words of description rather than limitation. Many modifications and variations of the invention are possible in light of the above teachings. Therefore, within the scope of the appended claims, the invention may be practiced other than as specifically described.

The invention claimed is:

1. A method of forming Monolithic CMOS-MEMS hybrid integrated, packaged structure comprising the steps of:
    providing at least one semiconductor substrate having a CMOS device area including dielectric layers and metallization layers;
    applying at least one protective layer overlying the CMOS device area;
    forming at least one opening on the protective layer and patterning the dielectric and metallization layers to access the semiconductor substrate;
        forming at least one opening on the semiconductor substrate by etching the dielectric and metallization layers;
        applying at least one filler layer in the at least one opening on the semiconductor substrate;
    positioning at least one chip on the filler layer, the chip including a prefabricated front face and a bare backside;
    applying a first insulating layer covering the front face of the chip providing continuity from the semiconductor substrate to the chip;
    forming at least one via opening on the insulating layer covering the chip to access at least one contact area;
    applying at least one metallization layer overlying the insulating layer on the substrate and the chip connecting the metallization layer on the substrate to the at least one another contact area on the chip;
    applying a second insulating layer overlying the metallization layer on the at least one chip;
    applying at least one interfacial layer;
    applying at least one rigid substrate overlying the interfacial layer;
        applying at least one secondary protective layer overlying the rigid substrate.

2. The method of claim 1, wherein the CMOS device area includes pre-fabricated structures selected from: multi level poly, multi level metal with digital logic circuits, operational amplifiers, inverters, analog and digital circuitry, digital switches, and voltage comparators.

3. The method of claim 1, wherein the protective layer is selected from variable temperature polymers including polyimide and parylene and lithographically patternable materials including photoresist materials.

4. The method of claim 1, wherein the step of forming an opening of the protective layer includes patterning the dielectric and metallization layers on the substrate material to create access to the semiconductor.

5. The method of claim 4, wherein the patterning includes photolithographically defining open areas and then etching.

6. The method of claim 5 wherein the etching is selected from: wet, dry, isotropic, and anisotropic etching.

7. The method of claim 1, wherein the filler material is selected from: polyimide, silicone, epoxy or their combination.

8. The method of claim 1, wherein the chip is selected from: commercial CMOS integrated circuits, electronics or diced chips from another MEMS/NEMS fabrication process.

9. The method of claim 8, wherein the CMOS integrated circuits are selected from: voltage comparators, diodes, opamps, power management circuits, resistors, capacitors, and inductors.

10. The method of claim 8, wherein MEMS/NEMS chips include transducers selected from chemical and biological, optical, mechanical, radiation, thermal, capacitive, magnetic and electromagnetic, flow, and micro-fluidic transducers.

11. The method of claim 1, wherein the first insulation layer covering the chip and the substrate is selected from oxides, nitrides, glass, quartz, and polymers.

12. The method of claim 1, wherein the metallization layer is selected from aluminum, titanium, chrome, gold, platinum or a combination of the same that can be evaporated, sputtered or electroplated.

13. The method of claim 1, wherein the second insulating layer overlying the metallization layer is selected from oxides, nitrides, glass, quartz, and polymers.

14. The method of claim 1, wherein the interfacial material is selected from metals including gold, and tin, alloys, and epoxy including Benzocyclobuten (BCB) and SU8 photoresist.

15. The method of claim 1, wherein the at least one rigid substrate overlying the interfacial layer is selected from ceramics, thermoplastics, thermosets, glass, silicon, quartz, plastic and metal.

16. The method of claim 1, wherein the secondary protective layer overlying the rigid substrate is selected from organic encapsulation including nonelastomeric thermoplastics including parylene, thermosetting polymers including silicones, polymides, and epoxies, metals or their combination.

17. A method of forming Monolithic CMOS-MEMS hybrid integrated, packaged device comprising the steps of:
    providing a semiconductor substrate having MEMS/NEMS materials including mechanical structural layers and conductive layers;
    applying a first insulating layer overlying the MEMS/NEMS materials;
    applying at least one protective layer overlying the MEM/NEMS materials;
    forming at least one opening on the protective layer to access the semiconductor substrate;
        applying at least one filler layer in the at least one opening on the semiconductor substrate;
    positioning at least one chip on the filler layer, the chip including a front face and a bare backside;
    applying a second insulating layer covering the front face of the chip providing continuity from the semiconductor substrate to the chip;
    forming at least one via opening on the insulating layer covering the chip to access at least one contact area;
    applying at least one metallization layer overlying the insulating layer on the substrate and the chip connecting the metallization layer on the substrate to the at least one contact area on the chip;
    applying a third insulating layer overlying the metallization layer on the at least one chip;
    performing at least one post micro/nano fabrication etching step forming a released structure;
    applying at least one interfacial layer;
    applying at least one rigid substrate overlying the interfacial layer;
    applying at least one secondary protective layer overlying the rigid substrate.

18. The method of claim 17, wherein the first insulating layer includes materials selected from LPCVD deposited materials including oxides and nitrides, polymers including parylene and polyimide, glass, and quartz.

19. The method of claim 17, wherein the mechanical structural layer is selected from LPCVD deposited materials, polymer, metal, and single crystal silicon.

20. The method of claim 19, wherein the LPCVD deposited materials is selected from oxides, nitrides, and polysilicon.

21. The method of claim 20, wherein conductive layer is selected from materials doped with boron or phosphorous, polysilicon, single crystal silicon, aluminum, copper, titanium, chrome, gold, silver, or their combination.

22. The method of claim 19, wherein the polymer is selected from parylene, polyimide and silicone.

23. The method of claim 19, wherein the metal is selected from aluminum, titanium, chrome, gold, platinum or a combination of the same that can be evaporated, sputtered or electroplated.

24. The method of claim 17 wherein the protective layer is selected from variable temperature polymers including polyimide and parylene and lithographically patternable materials including photoresist materials.

25. The method of claim 17, wherein the step of forming an opening of the protective layer includes patterning the dielectric and metallization layers on the substrate material to create access to the semiconductor.

26. The method of claim 25, wherein the patterning includes photolithographically defining open areas and then etching.

27. The method of claim 26 wherein the etching is selected from: wet, dry, isotropic, and anisotropic etching.

28. The method of claim 17, wherein the filler material is selected from: polyimide, silicone, epoxy or their combination.

29. The method of claim 17, wherein the chip is selected from: commercial CMOS integrated circuits, electronics or diced chips from another MEMS/NEMS fabrication process.

30. The method of claim 29, wherein the CMOS integrated circuits are selected from: voltage comparators, diodes, op-amps, power management circuits, resistors, capacitors, and inductors.

31. The method of claim 29, wherein MEMS/NEMS chips include transducers selected from chemical and biological, optical, mechanical, radiation, thermal, capacitive, magnetic and electromagnetic, flow, and micro-fluidic transducers.

32. The method of claim 17, wherein third insulation layer covering the chip and the substrate comprises materials selected from oxides, nitrides, glass, quartz, and polymers.

33. The method of claim 17, wherein the metallization layer is selected from aluminum, titanium, chrome, gold, platinum or a combination of the same that can be evaporated, sputtered or electroplated.

34. The method of claim 17, wherein the second insulating layer overlying the chip is selected from oxides, nitrides, glass, quartz, and polymers.

35. The method of claim 17, wherein the third insulating layer overlying the metallization layer is selected from oxides, nitrides, glass, quartz, and polymers.

36. The method of claim 35, wherein the polymers are selected from parylene, and polyimide.

37. The method of claim 17, wherein the micro/nano fabrication etching step is selected from wet, dry, isotropic, and anisotropic etching.

38. The method of claim 17, wherein the micro/nano fabrication etching further comprises surface micromachining, bulk micromachining, dry etching, and chemical etching from a backside of the substrate.

39. The method of claim 17, wherein the interfacial material is selected from metals including gold, and tin, alloys, and epoxy including Benzocyclobuten (BCB) and SU8 photoresist.

40. The method of claim 17, wherein the at least one rigid substrate overlying the interfacial layer is selected from ceramics, thermoplastics, thermosets, glass, silicon, quartz, plastic and metal.

* * * * *